United States Patent [19]

Prigge et al.

[11] Patent Number: 4,968,381
[45] Date of Patent: Nov. 6, 1990

[54] METHOD OF HAZE-FREE POLISHING FOR SEMICONDUCTOR WAFERS

[75] Inventors: Helene Prigge, Unterschleissheim; Anton Schnegg, Burghausen; Gerhard Brehm, Emmerting; Herbert Jacob, Burghausen, all of Fed. Rep. of Germany

[73] Assignee: Wacker-Chemitronic Gesellschaft fur Elektronik-Grundstoffe mbH, Burghausen, Fed. Rep. of Germany

[21] Appl. No.: 250,394

[22] Filed: Sep. 28, 1988

[30] Foreign Application Priority Data

Oct. 16, 1987 [DE] Fed. Rep. of Germany ....... 3735158

[51] Int. Cl.$^5$ .......................................... H01L 21/306
[52] U.S. Cl. .................... 156/636; 156/651; 156/903; 134/26; 252/79.1
[58] Field of Search ............... 156/651, 636, 645, 642, 156/662, 903; 252/79.1, 79.5; 134/21, 26, 28, 29

[56] References Cited

U.S. PATENT DOCUMENTS

| | | | |
|---|---|---|---|
| 3,485,608 | 12/1969 | Cecil | 51/308 |
| 3,874,129 | 4/1975 | Deckert et al. | 51/308 |
| 3,979,239 | 9/1976 | Walsh | 252/79.2 |
| 4,050,954 | 9/1977 | Basi | 134/28 |
| 4,064,660 | 12/1977 | Lampert | 51/308 |
| 4,070,797 | 1/1978 | Griesshammer et al. | 51/326 |
| 4,549,374 | 10/1985 | Basi et al. | 106/3 |
| 4,837,923 | 6/1989 | Brar et al. | 29/603 |

OTHER PUBLICATIONS

"Modern Silicon Technology" by Herrmann et al., (1975), pp. 302-303.
Kirk-Othmer Encyclopedia of Chemical Technology, 3rd ed., vol. 17, 1982, pp. 26-29 and 34.
Holleman-Wiberg Lehrbuch der Anorganischen Chemie, (1976), p. 297.

Primary Examiner—David L. Lacey
Assistant Examiner—John J. Bruckner
Attorney, Agent, or Firm—Collard, Roe & Galgano

[57] ABSTRACT

A polishing process in which haze-free semiconductor wafers can be obtained in a single-stage process in which an initial phase of the polishing operation is carried out in the usual manner in the alkaline region. This initial stage is followed by a final phase in which polishing is carried out, at a pH of 3 to 7, in the presence of additives in the polishing agent which reduce the amount of material removed by polishing. Consequently, it may be possible to dispense with polishing agent components which act mechanically. Both phases can be carried out on one and the same equipment without interrupting the polishing operation.

8 Claims, No Drawings

METHOD OF HAZE-FREE POLISHING FOR SEMICONDUCTOR WAFERS

BACKGROUND OF THE INVENTION

1. Field of the Invention

The present invention relates to a process for haze-free polishing of semiconductor wafers or slices in a one-stage process in which a polishing sol or gel, or an alkaline polishing agent containing solid polishing components is applied to the polishing cloth in the initial phase.

2. Description of the Prior Art

Such a process is described in the German Offenlegungsschrift No. 2,531,431 or the corresponding U.S. Pat. No. 4,070,799. In the final phase of the process, that is to say, the phase of the polishing operation in which the actual haze-free polish is effected, a polishing agent additive comprising 0.1 to 10% by weight, based on the polishing agent, of an anion-active and/or non-ionogenic tenside containing no nitrogen in the molecule is added to the polishing agent of the initial phase. Since with this procedure, however, the tensides remaining in the polishing cloth may reduce the polishing removal of the first stage in the case of a subsequent batch of semiconductor slices, it is recommended that the polishing process be carried out as a two-stage process, i.e. separately on two different polishing machines and in a polishing stage effecting the removal and a polishing stage effecting the haze-free polish.

In the method described in German Offenlegungsschrift No. 2,247,067 or the corresponding U.S. Pat. No. 3,874,129, a two-stage process is also carried out. A polishing suspension to which 1 to 10% by volume of a monohydric alcohol containing 3 to 5 carbon atoms and 0.01 to 0.5% by weight of polyvinyl alcohol are added is used in the second stage. However, both the processes, which are very efficient per se, yield excellent results, for example, in relation to the removal rates and the freedom from haze of the wafers obtained, as two-stage processes.

SUMMARY OF THE INVENTION

It is an object of the invention to provide a process by which semiconductors and in particular silicon wafers, with a haze-free polish can be obtained in a one-stage process, without changing equipment and interrupting the polishing process.

The object is achieved by a process which comprises applying to the polishing cloth in the final phase operation a polishing solution which is adjusted to a pH of 8 to 3, which contains 0.1 to 10% by volume of one or more compounds containing hydrophilic and hydophobic groups and selected from the group comprising alcohols, ketones, esters, ethers or amides, and/or which contains under 0.1% by volume of a surface-active substance.

In the process, during the initial phase of the polishing operation which proceeds in the alkaline pH range, a polishing agent adjusted to a pH of 11 to 13 is preferably used. In this connection, the pH may be adjusted in a known manner, for example by using suitable aqueous buffer systems, such as, for instance, a disodium hydrogenphosphate/sodium hydroxide solution buffer or a potassium chloride/sodium hydroxide solution buffer. The use of buffer systems is, however, not mandatory, as it is possible to adjust to the suitable pH range with the aid of suitably concentrated or diluted alkaline aqueous solutions of, for example, sodium or potassium hydroxide, sodium or potassium carbonate, sodium acetate or other salts which have an alkaline reaction and do not contaminate the wafers in an impermissible manner.

The polishing solution used in the initial phase contains as an additional component, 1 to 20% by volume of a polishing sol or gel, beneficially based on silicic acid, or a solid polishing component, such as, for example, quartz flour, or silicates or fluoro silicates, for example, of sodium, potassium, magnesium, calcium or barium. Such additives are generally standard and are known to the person skilled in the art, for example, from the patent literature mentioned above; they do not therefore require a more detailed explanation here.

As a rule, a time duration of 5 to 100 minutes is maintained for the initial phase of the polishing operation. This phase is chiefly concerned with material removal, in accordance with the desired removal and the removal rate, common removal values being in the range from 10 to 60 $\mu$m. These values are to be understood as a guide, but not in the sense of a restriction.

The polishing agent may be applied in the usual manner to the polishing cloth, for example by pumping the ready-made suspension from a reservoir via supply pipes to the position of use. The polishing agent is distributed over the polishing cloth at the position of use, possibly after setting a desired flow rate by means of a flow regulator. Excess or used polishing liquid is collected underneath the polishing table in a collecting device and can then be disposed of or reused after a treatment step.

When the desired removal has been achieved, as a rule after the time duration of the polishing operation specified by the removal rate, the initial phase is merged into the final phase in which, instead of material removal during polishing, the emphasis is on the production of a haze-free surface.

For this purpose, the pH of the aqueous solution applied to the polishing cloth is reduced to the range of 3 to 8, preferably 3 to 7, without interrupting the polishing operation. This may be carried out, for example, by reducing the pH to the desired range by acidifying the polishing agent of the initial phase. In addition, there is also, for example, the possibility of replacing the polishing agent of the initial phase by an aqueous acid or buffer solution having the desired pH, for example, by means of a three-way tap system.

Acids particularly suitable for use are, for example, carboxylic acids such as citric acid or tartaric acid which are preferably used because of their easy manageability. However, limits are imposed on the use of acetic or formic acid, which can possibly be used in principle, even with their odor nuisance. In addition, the use of dilute aqueous mineral acids, such as hydrochloric acid, sulfuric acid or phosphoric acid is not excluded in principle. Buffer systems which are effective in the pH range of 3 to 7 have also proved successful, such as, for example, acetic acid/acetate, citric acid/citrate, or phthalic acid/phthalate buffers.

Further additives which promote the formation of haze-free semiconductor surfaces are added to the polishing solution used in the final phase of the polishing operation. Such substances are, in particular, alcohols, preferably containing at least 2 carbon atoms in the molecule. In this connection, monohydric or polyhydric, aromatic, aliphatic or heterocyclic alcohols may be used. The use of silanols has also proved to be beneficial. Examples of particularly well suited alcohols are ethanol, isopropanol, n-butanol, tertiary butanol, 1-methoxy-2-propanol, trimethylsilanol, cyclohexanol, glycerol or phenol. It is also possible to add compounds from which the desired additive is formed in situ, such as, for example, hexamethyldisilazane which is then cleaved hydrolytically into trimethylsilanol.

Other polar organic compounds may also be used, in principle, as additives provided they do not have too strong an alkaline effect and raise the pH of the polishing solution above the upper limit of 8. By way of example, ethers and polyethers, such as, diethyleneglycoldiethyl ether or diethyleneglycoldimethyl ether, dioxane, hexamethyldisiloxane or dimethyldimethoxysilane, esters such as butyl acetate, amides such as acetamide or dimethyl acetamide, and ketones, such as acetylacetone may be used.

Such additives, which have hydrophilic and hydrophobic groups available in the molecule, are used in concentrations of 0.01 to 10% by volume, preferably 0.1 to 5% by volume, in each case based on the polishing solution. At the same time, two-component or multi-component mixtures, such as, for example, n-butanol/ethanol, n-butanol/glycol or trimethylsilanol/ethanol, may also be used, typically in mixing ratios of 1:5 to 5:1, advantageously 1:2 to 2:1.

In addition to the additives mentioned, surface-active substances are also suitable, provided steps are taken to ensure that the pH range of 3 to 8 is maintained. Suitable surfactants are those based on alkylphenols, such as, for example, nonylphenol polyglycol ether, or on alkyl- or alkylarylsulfonates, such as, for example, sulfosuccinates or even polyacrylates. The concentration range in which such substances are added to the polishing solution is expediently less than 0.1% by volume, in each case based on the polishing solution.

Particularly beneficial are those additives which effect a marked reduction of the amount of material removed by polishing in the acid to weakly alkaline region, but substantially lose this property in the alkaline region. In this manner, problems with the subsequent batch of semiconductor slices or wafers due to deactivation of the polishing operation in the initial phase can be avoided or kept few in number.

According to a preferred embodiment of the process, one or more of the solid polishing components, or a polishing gel, in particular a polishing sol are additionally added to the polishing solution in the final phase. The proportion of polishing agent may in that case be up to 10% by volume, advantageously up to 5% by volume. The addition of these components is not, however, essential; in principle, haze-free surfaces of semiconductor wafers can also be achieved with polishing solutions not containing such components. If such an addition is made, that additive is expediently selected which was also added to the polishing agent in the initial phase; this too, however, is not essential.

A time duration of 3 to 20 minutes has in general proved to be adequate for the final phase of the polishing operation. In this case, the polishing agent provided may be made available already mixed with additives and components in a reservoir from which it can then be applied to the polishing cloth via supply lines by means of pumps. Equally possible, however, are procedures in which the constituents, provided in each case, of the polishing agent are made available in separate stock vessels and are only combined in the supply lines or in a mixing station upstream of the polishing mixture which is finally fed to the polishing cloth.

In an advantageous embodiment of the process according to the invention an intermediate phase is inserted between the initial and final phase of the one-stage polishing operation. In this intermediate phase, a polishing agent, the pH of which has been slightly reduced compared with the polishing agent of the initial phase and adjusted to a value of 9 to 11, is applied to the polishing cloth. This can be carried out, for example, by means of a borate or hydrogen carbonate buffer, or often even by simple dilution.

Expediently, the polishing agent of the intermediate phase contains up to 10% by volume of the polishing sol or gel, or the solid polishing component which was also added to the polishing agent of the initial phase. In principle, however, recourse may also be made to the other suitable additives mentioned by way of example above.

As a result of the additional intermediate phase, a gentler transition from the alkaline initial phase to the acid final phase of the polishing operation is achieved, and this ultimately benefits the surface quality of the semiconductor wafers obtained. In general, a time duration of 2 to 10 minutes is sufficient for the intermediate phase. Subsequently, similarly to the procedure with a direct changeover from the initial to the final phase, the polishing agent of the final phase can be applied to the polishing cloth without the polishing operation having to be interrupted.

After completion of the final phase, the semiconductor wafers obtained which have a haze-free surface may be removed and, optionally, further processed after a cleaning step. The polishing table can then be loaded with a new batch of semiconductor wafers and the initial phase of the next polishing operation initiated.

The process according to the present invention can be used both for single-sided and for double-sided polishing. It is particularly suitable for polishing silicon wafers, although it is in principle also suitable for other elementary or compound semiconductors, such as, for example, germanium or gallium arsenide.

In the case of the wafers or slices obtained, the occurrence of so-called haze, often so named in the field, cannot be detected in the conventional examination with the naked eye in collimated light, i.e., the surface does not appear to have a milky turbidity, but is a satisfactorily shiny surface. Even with more sensitive methods of measurement in which the surface is scanned with laser beams and the scattered light then measured (cf. for example, German Patent Application No. P3,637,477.6-52), the pattern of the scattered light curve which is characteristic of polished semiconductor surfaces which are not haze-free cannot be detected. In the present process the concentration of the necessary additives can be kept low in the haze-free polishing and an activation or deactivation respectively of the additives is also possible as a result of the different pH ranges in the initial and final phase. Therefore, it is possible to dispense with multi-stage processes with their tim-consuming equipment changes, which are expensive in terms of additional equipment and require additional particularly hazardous start-up operations. This has a particularly beneficial effect where two-sided polishing is performed.

The invention will now be described in further detail with reference being made to the following examples. It should, however, be recognized that the examples are given as being illustrative of the present invention and are not intended to define the spirit and scope thereof.

EXAMPLE 1

Five (5) silicon wafers (etched on both sides, diameter approximately 7.5 cm, thickness approximately 550 $\mu$m, (100) orientation) were each placed individually in suitable spacer disks in a commercial two-sided polishing machine.

During the polishing operation, the rotating plates were each rotated in a different direction of rotation and a pressure of approximately 3 bar was applied to the equipment. A polishing agent containing 10% by volume of silicic acid sol and adjusted to a pH of 12.5 by means of potassium hydroxide was applied to the polishing cloth via a jet system from a reservoir with a flow rate of approx. 50 ml/min; the temperature was adjusted to approximately 30° C. The pH was measured, as it also was in the examples set forth below, by means of a calibrated pH electrode.

After approximately 90 minutes, the three-way tap upstream of the jet system was changed over and an aqueous solution adjusted to a pH of 10 by dilution and containing approximately 1% by volume of silicic acid sol was pumped at the same flow rate onto the polishing cloth. Without interrupting the polishing operation, this second polishing phase was maintained for approximately 10 minutes.

After this phase, a polishing solution (temperature approximately 25° C.) containing 1% by volume of silicic acid sol and 2% by volume of trimethylsilanol and adjusted to a pH of 7 by means of phosphoric acid was pumped into the polishing cloth in the third phase. This pumping of polishing solution took place while continuing the polishing operation, via the three-way tap and the jet system onto the polishing cloth at the same flow rate. This third phase lasted further 10 minutes. The removal achieved was then in total about 50 $\mu$m.

After terminating the polishing operation, the wafers were removed and checked for their surface quality after a cleaning step. When viewed in collimated light, both wafer surfaces appeared satisfactorily shiny, that is to say, they were haze-free. Even on examination by the more sensitive method of laser scanning and scattered light measurement, it was not possible to observe the pattern of the measurement curves which is typical of wafers affected by haze.

In the meantime, the polishing machine was again loaded with 5 wafers of the same specification. These were polished in the same manner and then examined for freedom from haze. These wafers also proved to be haze-free; the removal achieved in the polishing was again about 50 $\mu$m.

A total of 20 polishing runs were carried out in exactly the same manner. Using this process, it was not possible to detect any deterioration either in relation to the freedom of the wafers from haze or to the rate of removal determined.

COMPARISON EXAMPLE

Five (5) silicon wafers having the same specifications as described in Example 1 were polished with the procedure also as described in Example 1 while maintaining the same process parameters. In a first polishing step (approximately 90 minutes) a polishing solution containing 5% by volume of silicic acid sol was employed at a pH of 10 and 0.5% by weight of nonylphenol polyglycol ether was then added to this solution in the second machining stage.

A removal of approximately 30 $\mu$m was achieved in the first polishing run. The wafers obtained proved to be haze-free in collimated light. On examining with the more sensitive method of laser scanning and scattered light measurement, it was still possible, however, to detect traces of haze. On polishing the next batch of silicon wafers, it was possible to detect only a removal of approximately 6 $\mu$m after 90 minutes in the first polishing step. The polishing operation was no longer continued thereafter.

EXAMPLE 2

The polishing operation was carried out under the same conditions as specified in Example 1 without interruption. However, in the final phase, which also lasted 10 minutes, a polishing solution adjusted to a pH of 4 with the aid of phosphoric acid and containing approximately 1% by volume of silicic acid sol and approximately 5% by volume of butanol was applied to the polishing cloth.

With a removal of approximately 50 $\mu$m, wafers were obtained having surfaces on which it was not possible to detect haze either in collimated light or by the laser-scattered light method. With this polishing agent sequence, it was also possible to obtain satisfactorily haze-free wafers in 20 polishing runs with almost constant removal rate.

EXAMPLE 3

Silicon wafers were polished on both sides according to the procedure described in Example 1, but the intermediate phase was, however, dispensed with. In the initial phase (approximately 90 minutes), a polishing agent was used in this case which contained 5% by volume of silicic acid sol and was adjusted to a pH of 12.5 with potassium hydroxide. In the final phase of the polishing operation (approximately 20 minutes), a polishing solution containing 2% by volume of 1-methoxy-2-propanol and having a pH of 7.3 was pumped onto the polishing cloth.

The wafers obtained were completely haze-free on their upper and lower sides; the amount removed by polishing was approximately 50 $\mu$m. In this case, it was also possible to carry out 20 polishing runs in succession without a reduction in the surface quality of the wafers and of the removal rate.

EXAMPLE 4

A silicon wafer (diameter approximately 7.5 cm, (100) orientation, approximately 550 $\mu$m thick) was polished at a rate of rotation of the polishing plate of 300 rpm in a one-sided polishing machine for the individual polishing of semiconductor wafers. In this case, a polishing solution which contained approximately 5% by volume of silicic acid sol and the pH value of which had been adjusted to approximately 12.5 by means of potassium hydroxide was applied to the polishing cloth in the initial phase (approximately 30 minutes) with a flow rate of approximately 30 ml/min, a pressure of approximately 0.6 bar and a temperature at about 40° C. being set.

The pressure was then reduced to approximately 0.1 bar and the temperature to approximately 35° C. A solution adjusted to a pH of 10 by dilution was then first supplied as polishing agent for 5 minutes with a flow rate of 90 ml/min. Then, with pressure and temperature conditions unchanged, a solution adjusted to a pH of 7 by means of citric acid and containing 1% by volume of silicic acid sol and 4% by volume of n-butanol was pumped onto the polishing cloth.

The cleaned and inspected wafer removed after completing the polishing proved to be completely haze-free. A total of 16 polishing runs were carried out in succession by this procedure, haze-free wafers always being obtained. The removal rates achieved were between 50 and 60 $\mu$m.

While several embodiments and examples of the present invention have been described and/or shown, it is obvious that many changes and modifications may be made thereunto, without departing from the spirit and scope of the invention.

What is claimed is:

1. In a process for the haze-free polishing of a semiconductor surface by means of a polishing cloth, the improvement comprising the steps of:
    performing a polishing operation in a one-stage process by applying a polishing agent having at least one member selected from the group consisting of a polishing sol, a polishing gel, an alkaline polishing agent containing solid components, and a combination thereof to the polishing cloth in an initial phase of the polishing operation to thereby obtain a removal in the range of from 10 to 60 $\mu$m from the said semiconductor surface; and
    applying to the polishing cloth in a final phase of said polishing operation a polishing solution which is adjusted to a pH range of 3 to 8 and which contains at least one member selected from the group consisting of (a) from 0.1 to 10% by volume of at least one polar compound containing hydrophilic and hydrophobic groups and also selected from the group consisting of alcohols, ketones, ethers, esters and amides, (b) an ingredient which contains less than 0.1% by volume of a surface-active substance, and (c) a combination of (a) and (b) to thereby produce a haze-free surface for said semiconductor.

2. The process as claimed in claim 1, wherein up to 10% by volume of at least one member selected from the group consisting of polishing sol, polishing gel, solid polishing components and a combination thereof are additionally added to the polishing solution.

3. The process as claimed in claim 1, wherein said polar compound is an organosilicon compound selected from the group consisting of silanols, trimethylsilanol, hexamethyldisilazane, hexamethyldisiloxane and dimethyldimethoxysilane.

4. The process as claimed in claim 1, wherein said polishing agent is adjusted to a pH of 11 to 13 and contains up to 20% by volume of said member is used in said initial phase.

5. The process as claimed in claim 1, wherein, between the initial and final phase of said polishing operation, an intermediate phase is performed in which a polishing agent adjusted to a pH of 9 to 11 and containing up to 10% by volume of at least one member selected from the group consisting of a polishing sol, a polishing gel, a solid polishing component and a combination thereof is used.

6. The process as claimed in claim 5, wherein said intermediate phase has a time duration of 2 to 10 minutes.

7. The process as claimed in claim 1, wherein the final phase has a time duration of 3 to 20 minutes.

8. The process as claimed in claim 1, wherein the time duration of the initial phase is 5 to 100 minutes.

* * * * *